United States Patent
Axisa et al.

(10) Patent No.: US 9,418,927 B2
(45) Date of Patent: Aug. 16, 2016

(54) STRETCHABLE ELECTRONIC DEVICE

(75) Inventors: Fabrice Axisa, Sacierges-Saint-Martin (FR); Jan Vanfleteren, Gentbrugge (BE); Frederick Bossuyt, Harelbeke (BE)

(73) Assignees: IMEC, Leuven (BE); Universiteit Gent, Ghent (BE)

( * ) Notice: Subject to any disclaimer, the term of this patent is extended or adjusted under 35 U.S.C. 154(b) by 377 days.

(21) Appl. No.: 13/193,538

(22) Filed: Jul. 28, 2011

(65) Prior Publication Data
US 2012/0052268 A1    Mar. 1, 2012

Related U.S. Application Data

(63) Continuation of application No. PCT/EP2009/054353, filed on Apr. 10, 2009.

(60) Provisional application No. 61/148,894, filed on Jan. 30, 2009.

(51) Int. Cl.
*B32B 7/02* (2006.01)
*H05K 13/00* (2006.01)
*H01L 23/498* (2006.01)
(Continued)

(52) U.S. Cl.
CPC ...... *H01L 23/49838* (2013.01); *H01L 23/4985* (2013.01); *H05K 1/0283* (2013.01); *H01L 2924/0002* (2013.01); *H05K 3/007* (2013.01); *H05K 3/0032* (2013.01); *H05K 3/06* (2013.01); *H05K 3/4691* (2013.01); *H05K 2201/0133* (2013.01); *H05K 2201/09118* (2013.01); *H05K 2201/09263* (2013.01);
(Continued)

(58) Field of Classification Search
CPC ............. H01L 23/49838; H01L 23/4985; H01L 2924/0002; H01L 2924/00; H05K 1/0283; H05K 3/0032; H05K 3/007; H05K 3/06; H05K 3/4691; H05K 2201/09263; H05K 2201/09727; H05K 2203/0271; Y10T 428/24942; Y10T 29/49002
See application file for complete search history.

(56) References Cited

U.S. PATENT DOCUMENTS

2005/0280157 A1   12/2005   Roush et al.
2008/0157235 A1*   7/2008   Rogers et al. ................. 257/415
(Continued)

FOREIGN PATENT DOCUMENTS

WO   WO 2007/116344   10/2007
WO   WO 2008/030960   3/2008

OTHER PUBLICATIONS

Park et al. "Mechanical stress evolution in metal interconnects for various line aspect ratios and passivating dielectrics". Microelectronic Engineering 69 (2003); pp. 26-36.*
(Continued)

*Primary Examiner* — Prashant J Khatri
(74) *Attorney, Agent, or Firm* — Knobbe, Martens, Olson & Bear LLP

(57) ABSTRACT

A stretchable electronic device is disclosed. In one aspect, the device includes at least one combination of a stretchable electronic structure having a first Young's modulus and a rigid or flexible electronic structure having a second Young's modulus higher than the first Young's modulus. The stretchable electronic structure and the rigid or flexible electronic structure may be electrically connected to each other by a semi-transition structure having a third Young's modulus with a value in a range between the first and the second Young's modulus.

9 Claims, 8 Drawing Sheets

(51) Int. Cl.
*H05K 1/02* (2006.01)
*H05K 3/00* (2006.01)
*H05K 3/06* (2006.01)
*H05K 3/46* (2006.01)

(52) U.S. Cl.
CPC ............ *H05K 2201/09727* (2013.01); *H05K 2203/0271* (2013.01); *Y10T 29/49002* (2015.01); *Y10T 428/24942* (2015.01)

(56) References Cited

U.S. PATENT DOCUMENTS

2008/0257589 A1   10/2008   Ostmann et al.
2010/0002402 A1*  1/2010    Rogers et al. ............. 361/749

OTHER PUBLICATIONS

"Stiff subcircuit islands of diamondlike carbon for stretchable electronics". Journal of Applied Physics, vol. 100, No. 1, (2006); pp. 014913-1 to 014913-6.*

"Design of Metal Interconnects for Stretchable Electronic Circuits using Finite Element Analysis". 2007 International Conference on Thermal, Mechanical and Multi-Physics Simulation in Microelectronics and Micro-Systems, IEEE/Curran Publishing, (2007); pp. 1-6.*

"Stretchable Interconnects for Elastic Electronic Surfaces". Proceedings of the IEEE, vol. 93, No. 8, (2005); pp. 1459-1467.*

Lotters et al. "The mechanical properties of the rubber elastic polymer polydimethylsiloxane for sensor applications". Journal of Micromechanics and Microengineering, 7, (1997); pp. 145-147.*

International Search Report for International Application No. PCT/EP2009/054353 dated Nov. 9, 2009 by European Patent Office.

Huyghe et al., "Design and Manufacturing of Stretchable High-Frequency Interconnects", IEEE Transactions on Advanced Packaging, IEEE Service Center, Piscataway, NJ, US, vol. 31, No. 4, Nov. 2008, pp. 802-808.

Ostmann et al., "Manufacturing Concepts for Stretchable Electronic Systems", Microsystems, Packaging, Assembly & Circuits Technology Conference, Impact 2008 3$^{rd}$ International, IEEE, Piscataway, NJ, US, Oct. 2008, pp. 24-27.

Gray et al., "High-Conductivity Elastomeric Electronics", Advanced Materials, Wiley-Vch Verlag, Weinheim, DE, vol. 16, No. 5, May 2004, pp. 393-397.

* cited by examiner

STRETCHABLE ELECTRONIC DEVICE

CROSS REFERENCE TO RELATED APPLICATIONS

This application is a continuation of PCT Application No. PCT/EP2009/054353, filed Apr. 10, 2009, which claims priority under 35 U.S.C. §119(e) to U.S. provisional patent application 61/148,894 filed on Jan. 30, 2009. Each of the above applications is incorporated herein by reference in its entirety.

BACKGROUND OF THE INVENTION

1. Field of the Invention

The disclosed technology relates to a stretchable electronic device comprising a stretchable electronic structure electrically connected to a rigid or flexible electronic structure, and further relates to a method for manufacturing such a combined electronic device.

2. Description of the Related Technology

It is known to connect electronic devices with the aid of stretchable interconnections. Such stretchable interconnections allow for relative movement of the electronic devices with respect to each other.

WO2008030960 describes for instance a methodology to generate a stretchable electronic circuit or components, using controlled buckling structures.

In WO2007116344 a multitude of separate rigid islands are interconnected by stretchable electronic interconnections.

US2005280157 describes conductors comprising a series of repeating geometry features which are adapted to stretch the conductor rather than breaking.

In many applications, there is a need to connect a stretchable structure of an electronic device, such as for instance a stretchable electrical interconnection, to a rigid or flexible structure, such as for instance a functional electronic circuit. Some fields of application can be smart textile for leisure, medical or professional application, medical application for implant, car application for car furnishing or stretchable cables, aerospace application in harsh environment (vibration, chemical), but not limited thereto.

Mechanical tests on such a combined circuit show that the transition between the rigid or flexible structure and the stretchable structure is a weak point where the circuit tends to break easily.

SUMMARY OF CERTAIN INVENTIVE ASPECTS

Certain inventive aspects relate to an electronic device with an increased lifetime.

In one aspect, the device may comprise a semi-transition structure provided between an end part of the stretchable electronic structure and an end part of the rigid or flexible electronic structure for establishing the electrical connection between them, the semi-transition structure having a third Young's modulus with a value in a range between the first and the second Young's modulus.

With the known combined electronic devices, a stretchable structure is directly connected to a flexible/rigid structure. An analysis of these prior art structures has shown that, because the strain induced on the stretchable structure is very different under a mechanical stress compared to the strain induced on the flexible/rigid structure, a concentration of plastic deformation at the transition between both structures is introduced. This transition region creates a weak point where device is likely to break.

Because the Young's modulus of the semi-transition structure of the electronic device according to one inventive aspect has a value between that of the stretchable structure and the rigid/flexible structure, the semi-transition structure allows improving the repartition of mechanical stress in the stretchable substrate during any strain (elongation or torsion) of stretchable electronics.

The semi-transition structure functions as a semi-stretch transition zone, providing a transition between full stretchability and flexibility/rigidity. The semi-stretch zone is designed to have less deformation under a stress than the stretchable structure, as a result of which it is able to reduce the strain gap between the stretchable structure and the rigid/flexible structure. The result of this design is that the stresses don't come together at a limited region but can spread over a larger area.

The semi-transition structure can be obtained in any way considered suitable by the person skilled in the art. The semi-transition structure can for instance take the form of a cut in an edge of the rigid/flexible structure, a notch provided on the end part of the rigid/flexible structure, a meander shape with a width which is larger than the width of the meander in the stretchable part, or a meander with a width which is increasing gradually, or any combination thereof. Preferably, the semi-transition structure takes the form of a notch provided on an end part of the rigid/flexible structure in combination with a meander shape with a width which is gradually increasing, as this provides in a more sufficient structure.

Certain inventive aspects relate to a method for manufacturing an electronic device described herein.

In one approach, a semi-stretch interconnection is created separately and is attached afterwards during the process to a stretchable structure and a rigid/flexible structure of the electronic device. In another approach the semi-stretch structure can be created by patterning the conductor within the stretchable circuit during fabrication of the stretchable circuit. Both approaches will be described hereinafter in more detail below.

BRIEF DESCRIPTION OF THE DRAWINGS

The invention is further elucidated in FIGS. 1-9.

DETAILED DESCRIPTION OF CERTAIN ILLUSTRATIVE EMBODIMENTS

Definitions

With "rigid" as used in this application is meant stiff, unyielding, i.e. a rigid structure is not adapted to be deformable during normal use of the structure.

With "flexible" as used in this application is meant non-stiff, non-rigid, i.e. bendable but not stretchable. A flexible structure is adapted to be deformable in a certain direction during normal use of the structure, but does not elongate. The length does not change during bending.

With "stretchable" as used in this application is meant resilient, i.e. elastically deformable with elongation. A stretchable structure is adapted to be elastically deformed during normal use (with elongation). A stretchable structure can be made out of non-stretchable bulk materials, such as flexible materials or even rigid materials. An example is a metallic spring. The metal in itself is a rigid bulk material but the shaping of the material leads to a certain degree of flexibility and even a certain degree of stretchability.

Certain embodiments relate to an electronic device comprising at least one combination of a stretchable electronic structure having a first Young's modulus and a rigid or flexible electronic structure having a second Young's modulus higher than the first Young's modulus, the stretchable electronic structure and the rigid or flexible electronic structure being electrically connected to each other. Certain embodiments further relate to a method for manufacturing such a combined electronic device.

Figure 1:
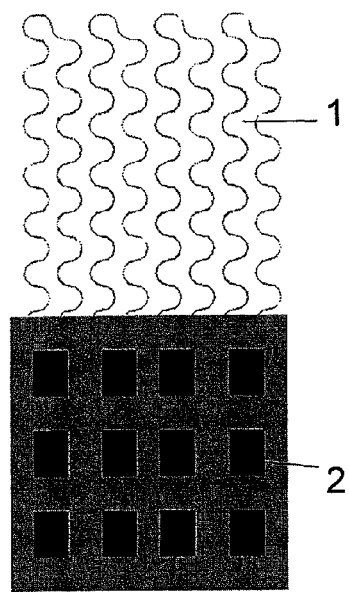
FIG. 1 shows an electronic device according to the state of the art comprising a rigid/flexible structure directly connected to a stretchable structure.

FIG. 1 shows an electronic device according to the state of the art, comprising a rigid/flexible structure 2 which is directly electrically connected to a stretchable structure 1. From an analysis of this structure, it has been concluded that because the strain of the stretchable structure 1 under a mechanical stress is very different of the strain of the rigid/flexible structure 2 under the same mechanical stress, a concentration of plastic deformation is induced at the transition between both structures. As a result, a weak point is created at the transition where the circuit tends to break.

To increase the lifetime of the electronic device, the concept of a semi-transition structure is introduced between the rigid/flexible structure and the stretchable structure. The semi-stretch transition structure has a Young's modulus at an intermediate level between the Young's modulus of the flexible structure and the flexible/rigid structure and is therefore able to reduce the strain gap between the stretchable part and the rigid/flexible part. As a result, the stresses don't come together at a limited region, but can be spread over a larger area, increasing the lifetime of the overall electronic device.

FIGS. 2(a)-2(d) show different examples of a semi-transition structure 13, 23, 33, 43 provided between a stretchable 11, 21, 31, 41 and a rigid/flexible structure 12, 22, 32, 42. The semi-transition structures 13, 23, 33, 43 comprise an electrically conductive material, with the aid of which an electrical connection can be established between the rigid/flexible structure 12, 22, 32, 42 and the stretchable structure 11, 21, 31, 41.

Figure 2:
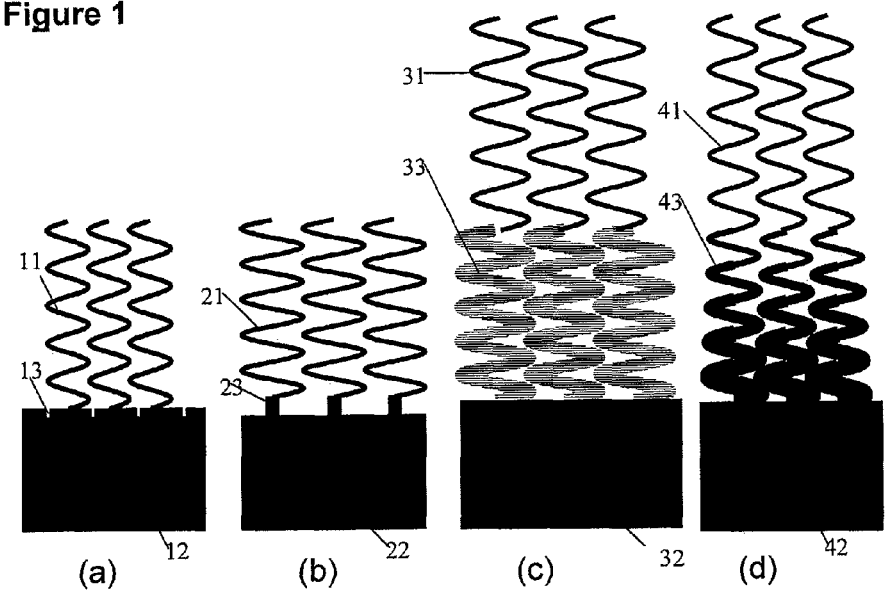
FIGS. 2(a)-2(d) show different examples of a semi-transition structure provided between a stretchable and a flexible/rigid structure.
Figure 3:
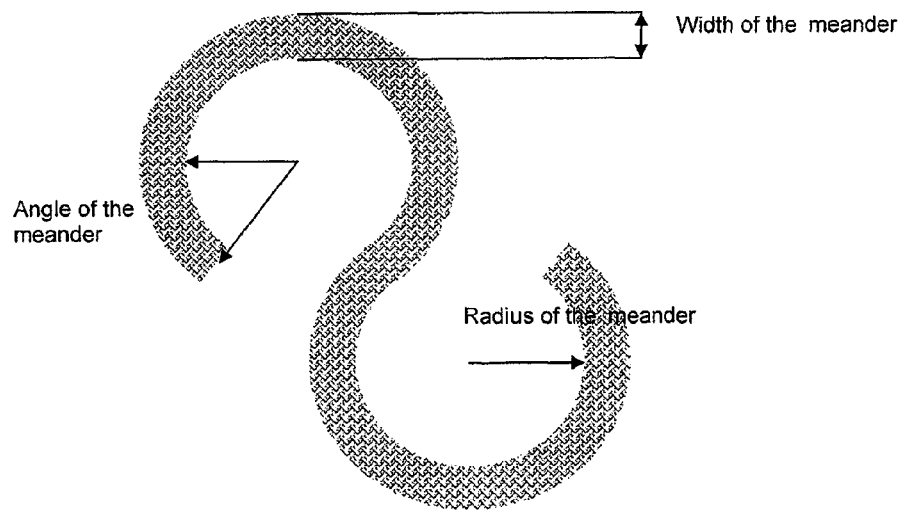
FIG. 3 shows a meander shaped structure, defined by a width, a radius and an angle.

The stretchable structures shown in FIGS. 2(a)-2(d) are made of meander shaped structures 11, 21, 31, 41, defined by an angle with respect to a 0°-baseline, a width and a radius as is shown in FIG. 3. The stretchable structures can be any other type of stretchable structures known to the person skilled in the art. By gradually varying the width and/or the angle and/or the radius of the meander shaped structures, a semi-transition structure can be obtained.

The rigid/flexible structure 12, 22, 32, 42 shown in FIGS. 2(a)-2(d) takes the form of a functional electronic component. The rigid/flexible structure can however take any form considered suitable by the person skilled in the art, such as a functional electronic circuit, an electrical interconnection or any flexible or rigid part or device.

In FIG. 2(a) the semi-transition structure 13 takes the form of cuts provided in an edge of the rigid/flexible structure 12. As a result of the cuts, the rigid/flexible structure is able to absorb part of the stresses induced at the transition between the flexible/rigid part 12 and the stretchable part 11, as a result of which the lifetime of the overall device can be increased.

In FIG. 2(b) the semi-transition structure 23 takes the form of notches, i.e. protrusions, extending from the flexible/rigid structure 22. The notches shown in FIG. 2(b) take the form of a rectangular protruding part, but can take any form considered suitable by the person skilled in the art.

In FIG. 2(c) the semi-transition structure 33 takes the form of a meander shaped structure with a width which is larger than the width of the meander of the stretchable structure 31. In FIG. 2(d) the semi-transition structure 43 takes the form of a meander shaped structure with a width which is increasing gradually (for example, from a width of 100 μm to a width of 300 μm) from the stretchable 41 to the rigid/flexible structure 42. A gradual transition can also be obtained with a meander shaped structure with a gradually decreasing angle (for example from an angle of 45 degree to an angle of 0 degree) from the stretchable to the flexible/rigid part, or with combination of a gradually decreasing angle and a gradually increasing width from the stretchable structure to the rigid/flexible structure. The semi-transition structure can be obtained by any combination considered suitable by the person skilled in the art, for instance by any combination of the structures shown in FIGS. 2(a)-2(d), for instance by a meander shaped structure with a gradually increasing width in combination with a notch or any kind of variation of geometry which reduce gradually the stretchability on an axis going from the stretchable part to the flexible/rigid part.

In general, the semi-transition structure may have a constant stretchability over its entire length, i.e. a constant Young's modulus along the semi-transition structure, or may have a gradually increasing stretchability from the stretchable to the rigid/flexible structure, i.e. a Young's modulus which increases gradually from the stretchable to the rigid/flexible structure.

Figure 4:
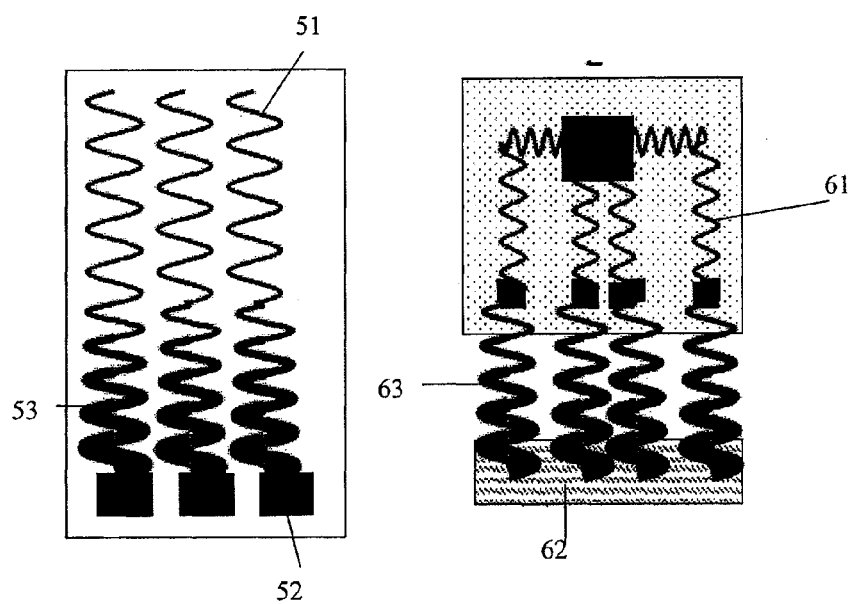
FIG. 4 shows two types of a semi-transition structure: type 4(a) is patterned together with the stretchable structure; type 4(b) is a separate structure connecting the stretchable structure with the flexible/rigid structure.

There are different ways to create a semi-transition structure. In one approach, the result of which is shown in FIG. 4(b), the semi-stretch interconnection 53' is created separately from the stretchable 51' and rigid/flexible structure 52' and is attached afterwards to both structures. In another approach, the result of which is shown in FIG. 4(a), the semi-transition structure 53 is created by patterning the conductor within the stretchable circuit. These approaches will be described in detail below.

Approach 1

The first method of manufacturing an electronic device with a semi-transition structure according to one embodiment is represented in detail in FIGS. 5(a)-5(k). In this approach a semi-stretch interconnection 63 is created which is attached afterwards during the process, such that it links the stretchable structure to the flexible/rigid structure.

FIGS. 5(a)-5(c) show an example of the different processing steps for manufacturing a flexible structure for application in an electronic device according to one embodiment. In FIG.

5(a) a substrate 64 is provided, laminated with an electrically conductive layer 65. In a next process shown in FIG. 5(b), the electrically conductive layer 65 is patterned to obtain electrically conductive tracks. FIG. 5(c) shows a next process, wherein an electronic component 66 is soldered on the substrate 64, such that a flexible structure 62 is obtained. The flexible/rigid structure can be made from polyimide comprising copper interconnects, but can also be made from PET, PEN, paper or any kind of flexible/rigid material.

FIG. 5(d) shows an example of a stretchable structure 61 obtained by any technology considered suitable by the person skilled in the art for application in an electronic device according to one embodiment. The stretchable circuit can be made of elastomeric polymer in which components and metallic and conductive tracks can be inserted. Materials for the elastomeric polymer can be PDMS and Polyurethane. The stretchable circuit can also be made of thermo plastic material or any kind of elastic polymer material.

The semi-transition structure is preferably made of polyimide laminated with copper, of polyimide deposited on copper. It can also be made of PET, PEN, paper or any kind of flexible material used for flexible electronic system.

The support can be made of ceramic or epoxy (FR4) plate. It can also be made of metal, plastic. The dimension of the support is related to the dimension of the design and/or related to the standard dimension of the substrate used in the art (for example: 4 inch or 8 inch).

Figure 5:
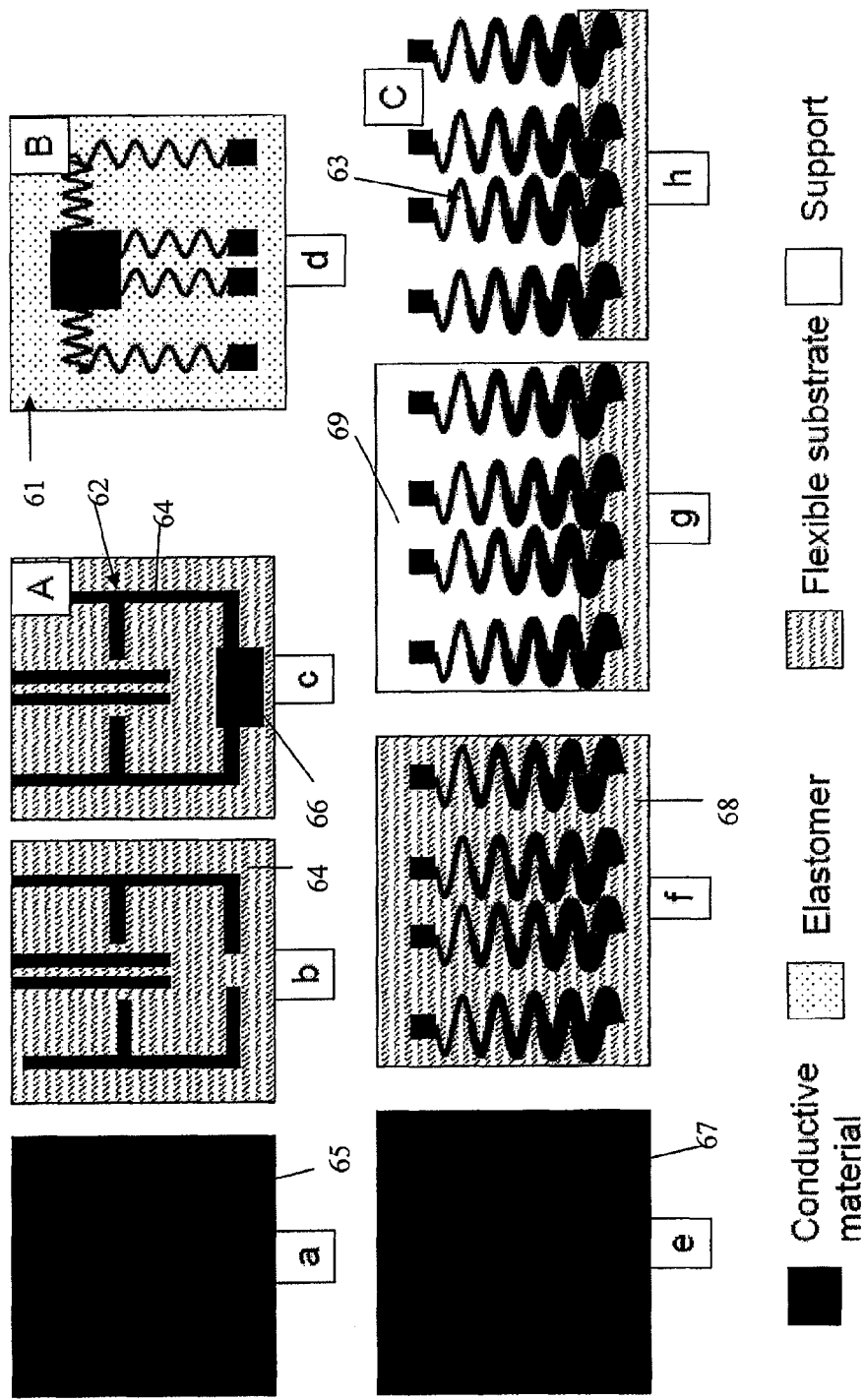
FIG. 5 shows the different process steps of a manufacturing method for realizing a semi-transition structure according to one embodiment.
Figure 5:
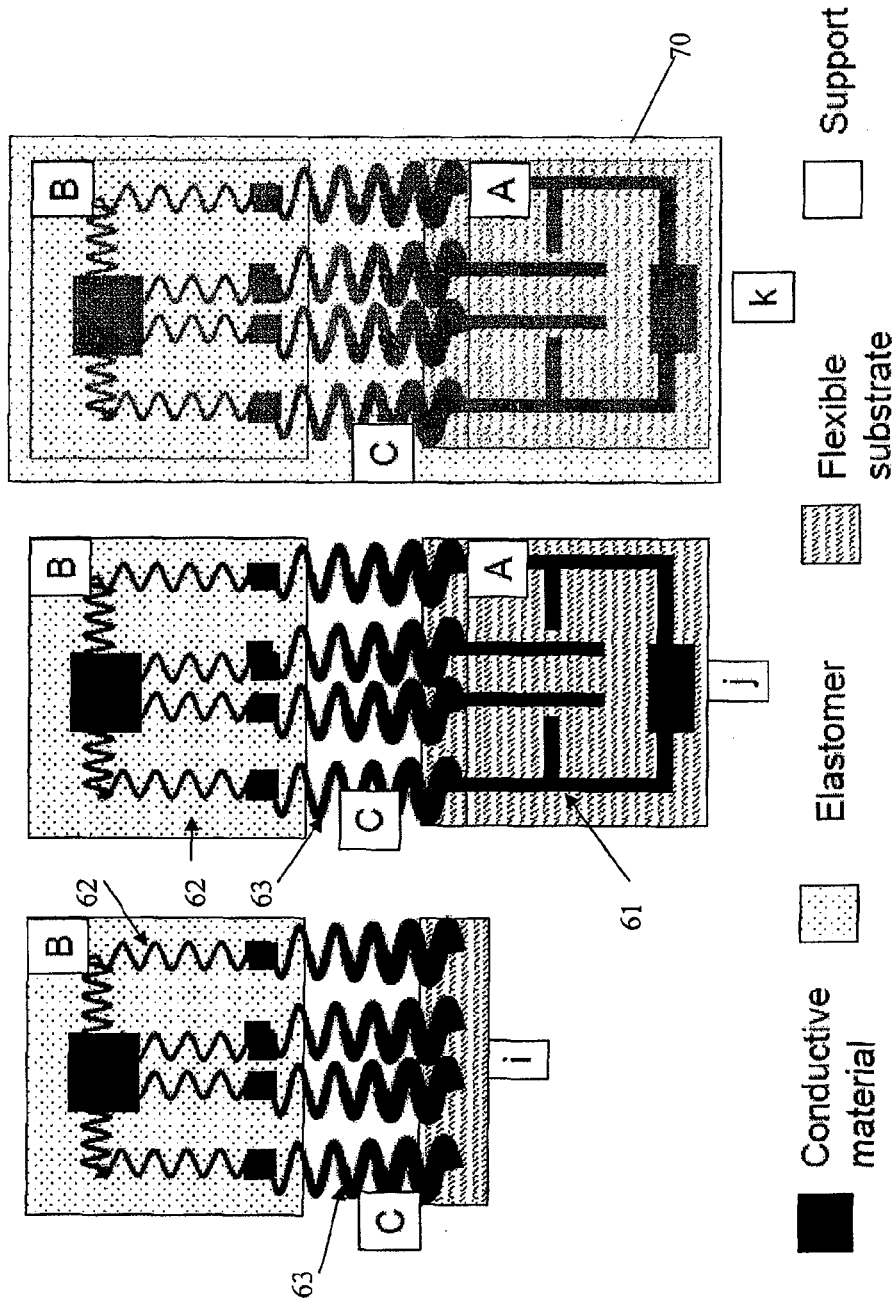

The dimensions of the flexible and stretchable circuits are related to the dimension of the design and/or related to the standard dimension of the substrate used in the art (for example: 4 inch or 8 inch). To realize a semi-stretch part 63 connecting the stretchable and flexible structures, parts can be cut out of the flexible substrate. At first the flexible substrate 67, 68 is set on the support 69 using adhesive (tape, wax, repositionable glue) to form a substrate suitable for cutting (FIG. 5.e). Then the flex can be cut using e.g. a YAG laser in order to form a pattern which is stretchable but with less stretchability than the stretchable circuit (FIG. 5.f). The pattern is cut using YAG laser, and the useless cut part is peeled off (FIG. 5.g). The flexible structure shown in FIG. 5(c) can be part of the structured flex of FIG. 5g. If the circuitry is not included in the flex, then semi-stretchable interconnection is obtained, interconnecting flex and stretch. If the circuitry is included in the flex (FIGS. 5.c and 5.g in 1 part), a flexible circuit is obtained with semi-stretchable interface. At this stage there are different possibilities amongst others.

In a first approach, the semi-stretch can be peeled off of the substrate (FIG. 5.h) and soldered to preferably the stretchable structure (FIG. 5.i) and then to the flexible structure (FIG. 5.j) (or first to the flexible structure and then subsequently to the stretchable structure). Peeling off of the semi-transition structure from the support can be done by dissolving the glue in solvent (acetone), or heating the adhesive, or mechanically. Then the resulting circuit of FIG. 5.j can be embedded (preferably molded, but also cast) in elastomer (resulting in FIG. 5.k).

In another approach, the semi-stretch transition structure can be embedded in an elastic polymer (preferably cast or molding according the technology for stretchable circuit), then is peeled of the substrate and soldered to preferably the stretch and then the flex (or first to the flex and then to the stretch).

In yet another approach the semi-transition structure can be soldered to preferably the stretchable structure and then to the flexible structure (or first to the flex and then to the stretch). Then the semi-transition structure is peeled off of the substrate The rigid or flex part can be connected via the semi-stretch to the stretchable part by solder or glue. It can be preferably soldered to the flex and/or the stretch using a solder reflow oven. Any kind of soldering technology which is currently used to interconnect flexible circuit can also be used. It can also be glued using elastic conductive glue like silver filled silicone based conductive isotropic adhesive. Then everything is embedded (preferably molded, but also cast) in elastomer 70.

Approach 2

Figure 6:
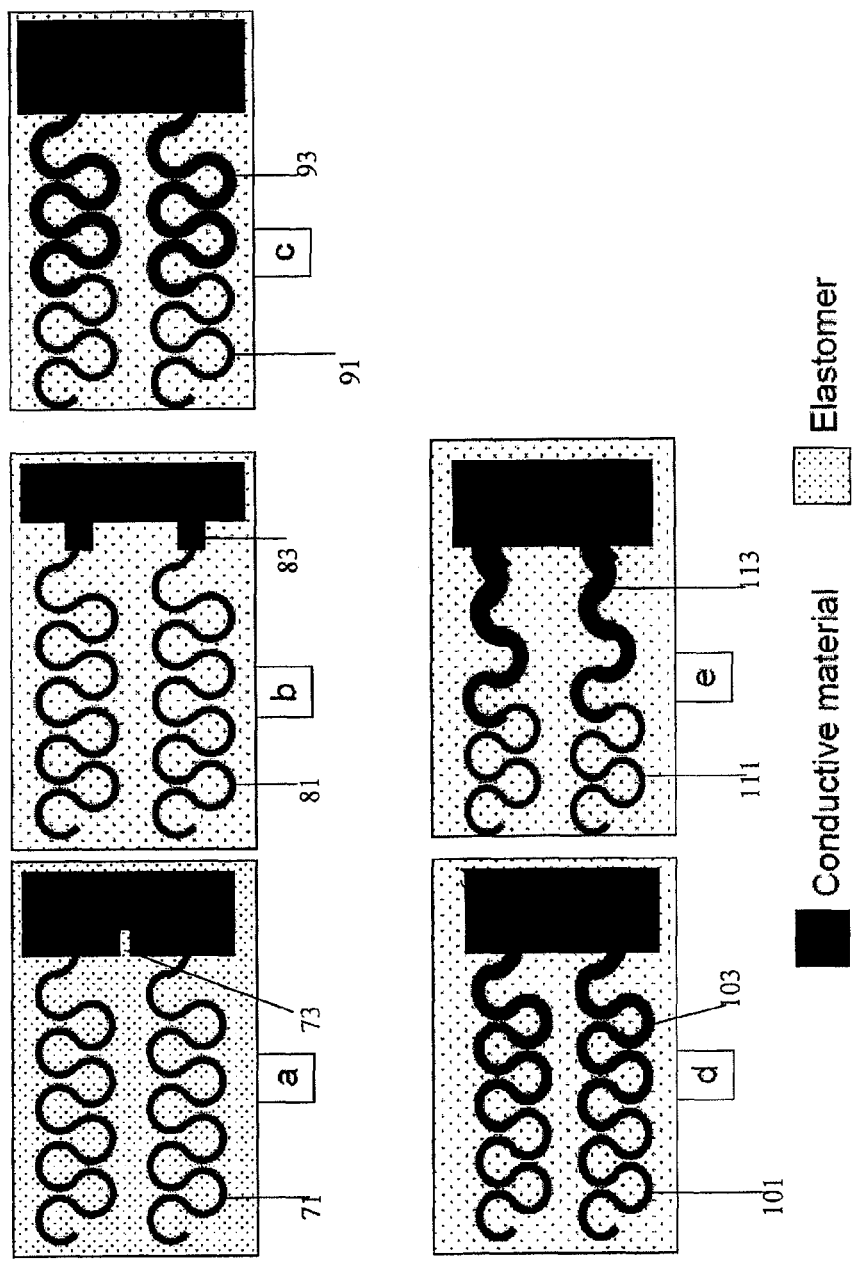
FIG. 6 shows different examples of a semi-stretch pattern of conductive tracks in a stretchable circuit: 6(a) a simple cut; 6(b) a notch; 6(c) wider meander; 6(d) gradually wider meander; 6(e) gradually wider and straighter meander.

In another approach the semi-stretch can be created by patterning the conductor within the stretchable circuit during the fabrication of the stretchable circuit. The stretchable circuit can be made of elastomeric polymer in where components and metallic and conductive tracks have been inserted. In one embodiment, preferred materials are PDMS and Polyurethane. It can be made also of thermo plastic material or any kind of elastic polymer material. The dimensions of stretchable circuit are related to the dimension of the design and/or related to the standard dimension of the substrate used in the art (for example: 4 inch or 8 inch). In this possibility, the gradual variation of geometry of the conductive tracks is included in the design of the conductor track. The gradual transition can be obtained by a simple cut 73 (FIG. 6.a), a notch 83 (FIG. 6.b), a meander 93 (FIG. 6.c) of which the width is larger than the width in the stretchable part, or a meander of which the width is increasing gradually (for example from a width of 100 μm to a width of 300 μm) from the more stretchable to the less stretchable part 103, 113, with or without a gradual decreasing of the angle (for example from an angle of 45 degree to an angle of 0 degree) (FIGS. 6.d and 6.e). The gradual transition can be also any combination of those transitions (for example gradually increasing width with a notch) or any kind of variation of geometry which reduce gradually the stretchability. The technology used to form this gradual transition can be the same as the technology to create the conductive tracks of the stretchable circuit. It can be lithography, printing, plating, etching or any technology used to deposit or to pattern conductive tracks. It can be a monolayer conductor (for example metal like copper or conductive ink), or a multilayer conductor (for example metal+ flexible polymer).

Figure 9:
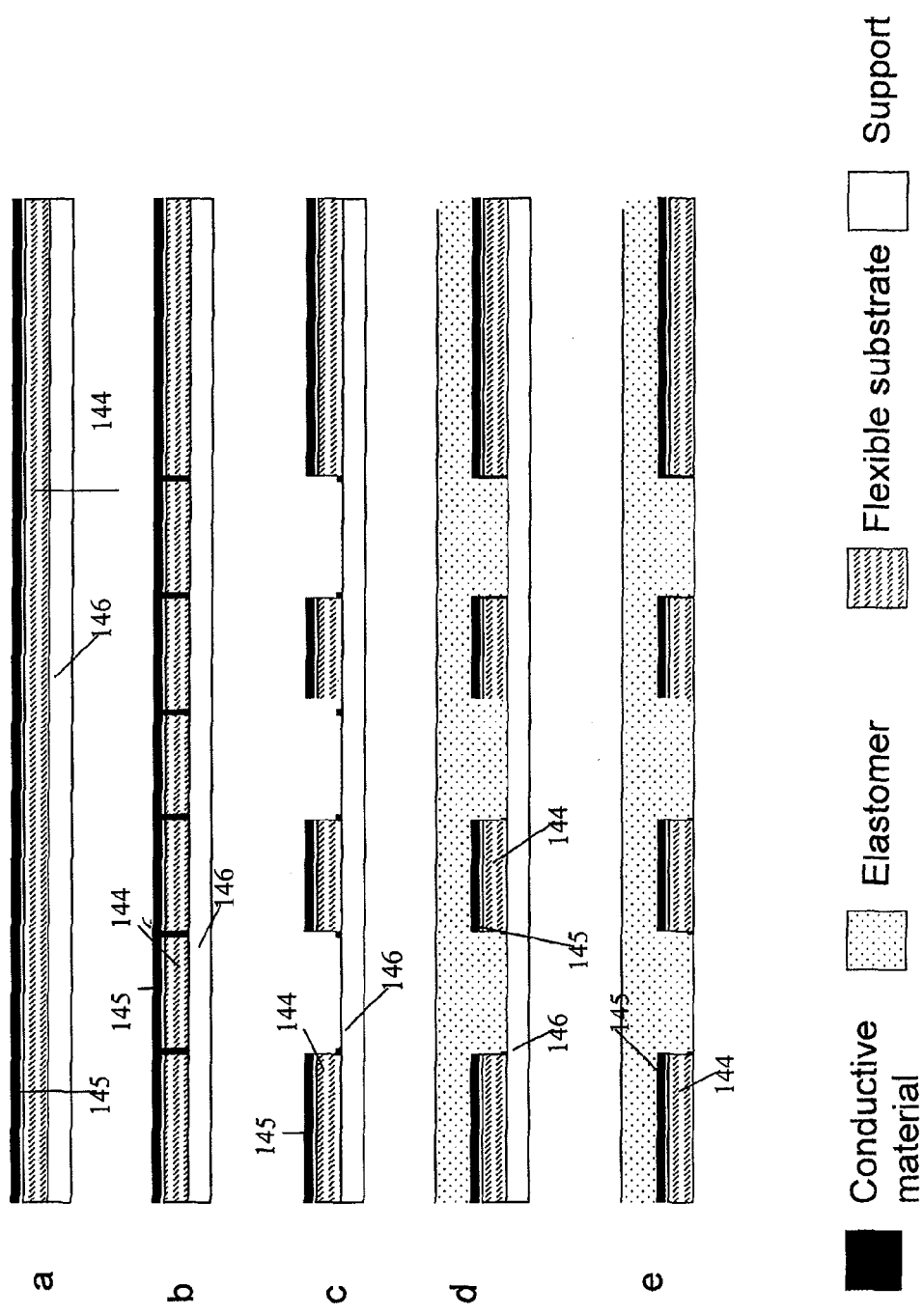
FIG. 9 shows the different process steps of a manufacturing method for realizing a semi-transition structure according to one embodiment.
Figure 9:
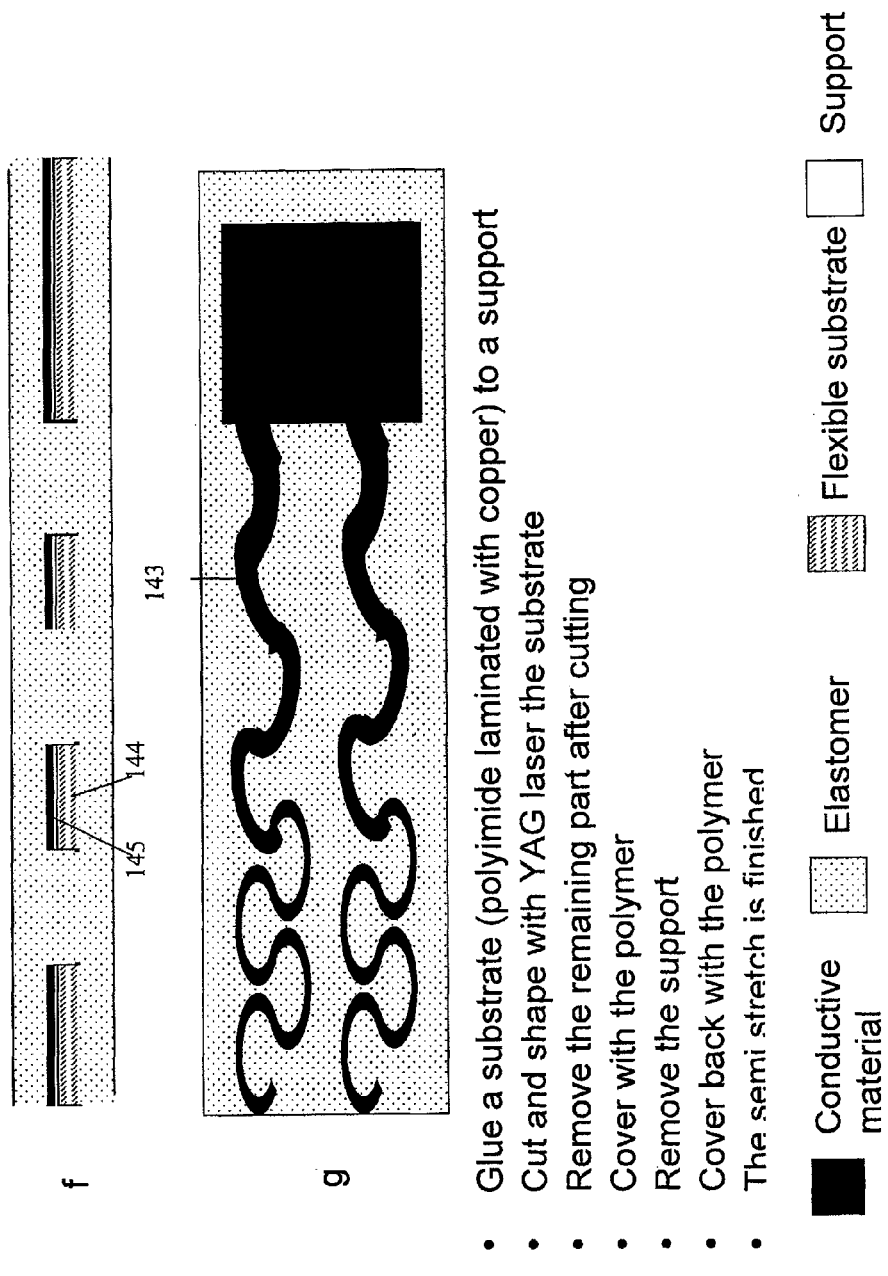

In general, a first embodiment of a method of manufacturing an electronic device according to one embodiment comprises (a) manufacturing a rigid or flexible electronic structure with a first Young's modulus, (b) manufacturing a stretchable electronic structure with a second Young's modulus, (c) manufacturing a semi-transition structure with a third Young's modules having a value between that of the first and the second Young's modulus, (d) electrically connecting a second end part of the semi-transition structure opposite the first end part to an end part of the stretchable electronic structure and (e) electrically connecting a first end part of the semi-transition structure to an end part of the rigid or flexible electronic structure, wherein process (c) may comprise (i) providing a supporting structure 146, (ii) connecting a substrate 144 on top of the supporting structure, (iii) laminating an electrically conductive layer 145 on top of the substrate, (iv) patterning the substrate and the electrically conductive layer to obtain a semi-transition structure, (v) removing the supporting structure 146, as is shown in FIGS. 9(a))-9(e). In FIG. 9(f) the back of the semi-transition structure is covered with a polymer.

In general, a second embodiment of a method of manufacturing an electronic device according to one embodiment comprises (a) providing a flexible substrate, (b) applying electrically conductive material on the substrate, (c) patterning a first part of the electrically conductive material so as to obtain the stretchable structure, (d) patterning a second part of the electrically conductive material adjacent the first part so as to obtain the semi-transition structure, whereby the patterning is such that the stretchable structure is electrically connected to a first end part of the semi-transition structure, (e) providing a rigid/flexible structure, (f) electrically connecting a second end part the semi-transition structure, opposite the first part, to an end part of the rigid/flexible structure.

Simulations show that a semi-transition structure decreases the maximum of plastic stress within a stretchable part by 30%, and therefore increases the life time of the stretchable part.

Experiment 1

Semi-Stretch Interconnection Fabricated as Interconnecting Element

Figure 7:
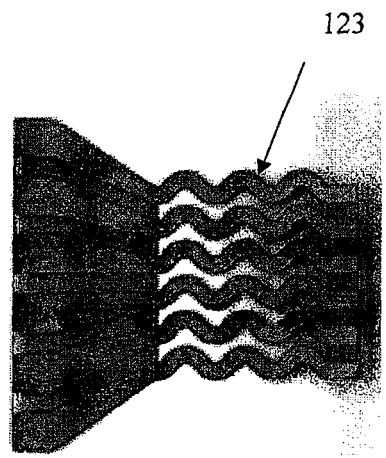
FIG. 7 shows one embodiment of a semi-stretch interconnection between a stretchable circuit and a flexible circuit.

The design consists in three parts (FIG. 7):
Connecting pads to the stretchable electronic board
Semi stretchable interconnects 123
Connecting pads to the flex.

The connecting pads are polyimide, covered with copper. The connecting pads to the stretch are attached together with a polyimide band to ease the manipulation after removing the support at the end of the process.

First, a polyimide foil (18 μm thick) covered with copper (9 μm thick) is patterned using standard photolithography and etching to create the pads and the interconnections between the pads. Then the substrate is stuck to a ceramic plate with double sided tape as a glue layer. Then a YAG laser is used to cut the polyimide foil to shape the semi-stretch interconnections, and then the semi-stretch interconnections are removed from the glue using heat. Then the semi-stretch is soldered with lead free reflow oven to the stretchable circuit and then to the flex board.

Experiment 2

Semi-Stretch Interconnection Fabricated with Photo-Lithography

Figure 8:
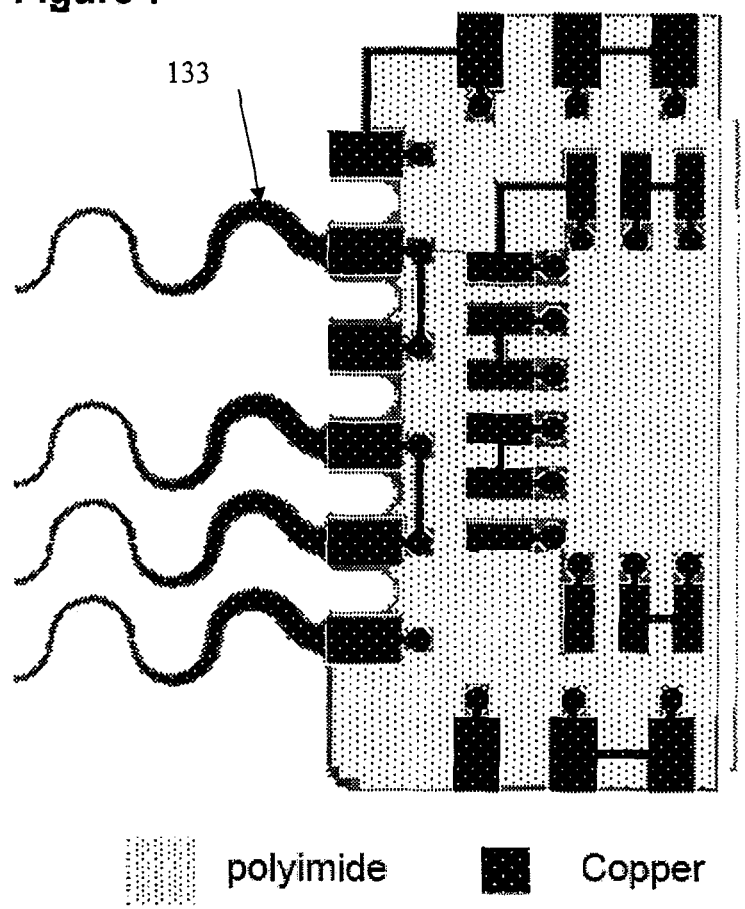
FIG. 8 shows a semi-stretch structure connecting a stretchable circuit (left) to a flexible circuit (right), using gradual increase of the width of the meander as semi-stretch structure.

The production starts with a plain copper foil, TW-YE (Circuitfoil), which is rough at one side and smooth at the other. Polyimide patterns e.g. non-stretchable islands and meanders are fabricated to support the metallic meanders, on the rough side of the copper. Due to the roughness of the copper and the self-priming property of the polyimide, we get a good adhesion. PI2731 was used as photo-definable polyimide to obtain the structures through spin-coating and photo-lithography. The samples are hard-baked in a nitrogen atmosphere following a dedicated temperature profile. With the laser, alignment holes are defined, to be able to pattern the copper on the backside relative to the polyimide structures. The copper with polyimide patterns is then laminated by use of wax on a flexible carrier, with the polyimide structures sandwiched between the copper and the carrier. Again, through standard lithography by use of photoresist AZ4562 and etching of the copper, we define structures in the copper. Embedding is done through molding or casting by use of a stretchable polymer. Following this procedure, we obtain stretchable parts, e.g. the copper meanders which are supported by the polyimide and non-stretchable flexible parts e.g. islands with components on supported by polyimide. The transition 133 between both is semi-stretchable as the width of the meanders is increasing close to the flexible part (FIG. 8).

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. An electronic device comprising:
at least one combination of a stretchable electronic structure, the stretchable electronic structure comprising a plurality of meander-shaped conductive structures each inserted in an elastomeric polymer and having a first Young's modulus, and a rigid or flexible electronic structure having a second Young's modulus higher than the first Young's modulus, the stretchable electronic structure and the rigid or flexible electronic structure being electrically connected to each other,
wherein the at least one combination further comprises a semi-transition structure located between an end part of the stretchable electronic structure and an end part of the rigid or flexible electronic structure and configured to establish the electrical connection therebetween, the semi-transition structure having a third Young's modulus with a value in a range between the first and the second Young's modulus,
wherein the semi-transition structure comprises a meander-shaped structure between the end part of the stretchable structure and the end part of the rigid or flexible structure.

2. The electronic device according to claim 1, wherein the value of the third Young's modulus is constant along the semi-transition structure.

3. The electronic device according to claim 1, wherein the value of the third Young's modulus increases along the semi-transition structure from a first value for a part of the semi-transition structure adjacent the end part of the at least one stretchable electronic structure towards a second value for a part of the semi-transition structure adjacent the end part of the at least one rigid or flexible electronic structure.

4. The electronic device according to claim 1, wherein the meander shaped structure of the semi-transition structure has a meander width which increases gradually from the end part of the stretchable structure towards the end part of the rigid or flexible structure.

5. The electronic device according to claim 1, wherein the stretchable electronic structure, the rigid or flexible electronic structure and the semi-transition structure have shapes and physical dimensions such that when the at least one combination is stretched, the semi-transition structure elongates by a relative magnitude that is between magnitudes of elongation of the stretchable electronic structure and of the rigid or flexible electronic structure.

6. The electronic device according to claim 5, wherein the semi-transition structure comprises an edge region of the rigid or flexible structure having one or more cut-out portions in the end part of the rigid or flexible structure.

7. The electronic device according to claim 5, wherein the semi-transition structure comprises at least one protrusion extending from the end part of the rigid or flexible structure and connected to the meander-shaped structure of the semi-transition structure.

8. The electronic device according to claim 7, wherein the stretchable structure is a meander shaped structure with a meander width smaller than a meander width of the meander shaped structure of the semi-transition structure.

9. The electronic device according to claim 5, wherein the meander-shaped structure of the semi-transition structure has a width which increases gradually from the end part of the stretchable structure towards the end part of the rigid or flexible structure.

\* \* \* \* \*